United States Patent
Bradley et al.

(10) Patent No.: US 9,142,220 B2
(45) Date of Patent: Sep. 22, 2015

(54) SYSTEMS AND METHODS FOR RECONSTRUCTING AN AUDIO SIGNAL FROM TRANSFORMED AUDIO INFORMATION

(75) Inventors: David C. Bradley, La Jolla, CA (US); Daniel S. Goldin, Malibu, CA (US); Robert N. Hilton, San Diego, CA (US); Nicholas K. Fisher, San Diego, CA (US); Rodney Gateau, San Diego, CA (US)

(73) Assignee: The Intellisis Corporation, San Diego, CA (US)

( * ) Notice: Subject to any disclaimer, the term of this patent is extended or adjusted under 35 U.S.C. 154(b) by 753 days.

(21) Appl. No.: 13/205,492

(22) Filed: Aug. 8, 2011

(65) Prior Publication Data

US 2012/0243705 A1 Sep. 27, 2012

Related U.S. Application Data

(60) Provisional application No. 61/467,493, filed on Mar. 25, 2011.

(51) Int. Cl.
*G10L 19/00* (2013.01)
*G10L 25/93* (2013.01)
(Continued)

(52) U.S. Cl.
CPC .................. *G10L 19/00* (2013.01); *G10L 13/00* (2013.01); *G10L 21/00* (2013.01);
(Continued)

(58) Field of Classification Search
CPC ......... G10L 25/93; G10L 25/90; G10L 25/45; G10L 21/0208; G10L 21/0232; G10L 19/00; G10L 13/00; G10L 21/00; H04R 29/00
USPC .............. 381/94.1, 94.4, 98, 101, 61; 700/94; 704/268, E13.004, 205, 200, 264, 265
See application file for complete search history.

(56) References Cited

U.S. PATENT DOCUMENTS

| | | | |
|---|---|---|---|
| 3,617,636 A | 11/1971 | Ogihara | |
| 3,649,765 A | 3/1972 | Rabiner et al. | |

(Continued)

FOREIGN PATENT DOCUMENTS

| | | | |
|---|---|---|---|
| CN | 101027543 A | 8/2007 | |
| CN | 101394906 A | 3/2009 | |

(Continued)

OTHER PUBLICATIONS

Serra, "Musical Sound Modeling with Sinusoids plus Noise", 1997, pp. 1-25.*

(Continued)

*Primary Examiner* — Vivian Chin
*Assistant Examiner* — David Ton
(74) *Attorney, Agent, or Firm* — Edell, Shapiro & Finnan, LLC

(57) ABSTRACT

A system and method may be configured to reconstruct an audio signal from transformed audio information. The audio signal may be resynthesized based on individual harmonics and corresponding pitches determined from the transformed audio information. Noise may be subtracted from the transformed audio information by interpolating across peak points and across trough points of harmonic pitch paths through the transformed audio information, and subtracting values associated with the trough point interpolations from values associated with the peak point interpolations. Noise between harmonics of the sound may be suppressed in the transformed audio information by centering functions at individual harmonics in the transformed audio information, the functions serving to suppress noise between the harmonics.

4 Claims, 5 Drawing Sheets

(51) Int. Cl.

| | |
|---|---|
| *G10L 21/0208* | (2013.01) |
| *G10L 13/00* | (2006.01) |
| *H04R 29/00* | (2006.01) |
| *G10L 21/00* | (2013.01) |
| *G10L 25/45* | (2013.01) |
| *G10L 25/90* | (2013.01) |
| *G10L 21/0232* | (2013.01) |

(52) U.S. Cl.
CPC ............ *G10L 21/0208* (2013.01); *G10L 25/93* (2013.01); *H04R 29/00* (2013.01); *G10L 21/0232* (2013.01); *G10L 25/45* (2013.01); *G10L 25/90* (2013.01)

(56) References Cited

U.S. PATENT DOCUMENTS

| | | | |
|---|---|---|---|
| 4,454,609 A | 6/1984 | Kates | |
| 4,797,923 A | 1/1989 | Clarke | |
| 5,054,072 A | 10/1991 | McAulay et al. | |
| 5,195,166 A | 3/1993 | Hardwick et al. | |
| 5,216,747 A | 6/1993 | Hardwick et al. | |
| 5,226,108 A | 7/1993 | Hardwick et al. | |
| 5,321,636 A | 6/1994 | Beerends | |
| 5,548,680 A | 8/1996 | Cellario | |
| 5,684,920 A | 11/1997 | Iwakami et al. | |
| 5,812,967 A | 9/1998 | Poceleon et al. | |
| 5,815,580 A | 9/1998 | Craven et al. | |
| 6,356,868 B1 | 3/2002 | Yuschik et al. | |
| 6,477,472 B2 | 11/2002 | Qian et al. | |
| 6,526,376 B1 | 2/2003 | Villette et al. | |
| 7,003,120 B1* | 2/2006 | Smith et al. | 381/61 |
| 7,016,352 B1 | 3/2006 | Chow et al. | |
| 7,117,149 B1 | 10/2006 | Zakarauskas | |
| 7,249,015 B2 | 7/2007 | Jiang et al. | |
| 7,389,230 B1 | 6/2008 | Nelken | |
| 7,596,489 B2 | 9/2009 | Kovesi et al. | |
| 7,660,718 B2 | 2/2010 | Padhi et al. | |
| 7,664,640 B2 | 2/2010 | Webber | |
| 7,668,711 B2 | 2/2010 | Chong et al. | |
| 7,672,836 B2 | 3/2010 | Lee et al. | |
| 7,774,202 B2 | 8/2010 | Spengler et al. | |
| 7,991,167 B2 | 8/2011 | Oxford | |
| 8,189,576 B2 | 5/2012 | Ferguson | |
| 8,212,136 B2 | 7/2012 | Shirai et al. | |
| 8,332,059 B2 | 12/2012 | Herre et al. | |
| 8,447,596 B2 | 5/2013 | Avendano et al. | |
| 8,548,803 B2 | 10/2013 | Bradley et al. | |
| 8,620,646 B2 | 12/2013 | Bradley et al. | |
| 8,666,092 B2 | 3/2014 | Zavarehei | |
| 8,767,978 B2 | 7/2014 | Bradley et al. | |
| 2002/0152078 A1 | 10/2002 | Yuschik et al. | |
| 2003/0014245 A1 | 1/2003 | Brandman | |
| 2003/0055646 A1 | 3/2003 | Yoshioka et al. | |
| 2004/0128130 A1 | 7/2004 | Rose et al. | 704/236 |
| 2004/0133424 A1 | 7/2004 | Ealey et al. | |
| 2004/0176949 A1 | 9/2004 | Wenndt et al. | 704/203 |
| 2004/0220475 A1 | 11/2004 | Szabo et al. | 600/458 |
| 2005/0114128 A1 | 5/2005 | Hetherington et al. | 704/233 |
| 2005/0149321 A1 | 7/2005 | Kabi et al. | |
| 2006/0080088 A1 | 4/2006 | Lee et al. | |
| 2006/0100866 A1 | 5/2006 | Alewine et al. | 704/226 |
| 2006/0122834 A1 | 6/2006 | Bennett | 704/256 |
| 2006/0149558 A1 | 7/2006 | Kahn et al. | |
| 2006/0262943 A1 | 11/2006 | Oxford | 381/92 |
| 2007/0010997 A1 | 1/2007 | Kim | 704/208 |
| 2007/0299658 A1 | 12/2007 | Wang et al. | |
| 2008/0082323 A1 | 4/2008 | Bai et al. | 704/214 |
| 2008/0183473 A1 | 7/2008 | Nagano et al. | |
| 2008/0270440 A1 | 10/2008 | He et al. | |
| 2009/0012638 A1 | 1/2009 | Lou | 700/94 |
| 2009/0076822 A1 | 3/2009 | Sanjaume | 704/268 |
| 2009/0091441 A1 | 4/2009 | Schweitzer, III et al. | |
| 2009/0228272 A1 | 9/2009 | Herbig et al. | 704/233 |
| 2010/0042407 A1 | 2/2010 | Crockett | |
| 2010/0215191 A1 | 8/2010 | Yoshizawa et al. | |
| 2010/0260353 A1 | 10/2010 | Ozawa | 381/94.3 |
| 2010/0262420 A1 | 10/2010 | Herre et al. | |
| 2010/0332222 A1 | 12/2010 | Bai et al. | 704/214 |
| 2011/0016077 A1 | 1/2011 | Vasilache et al. | 706/52 |
| 2011/0060564 A1 | 3/2011 | Hoge | 703/2 |
| 2011/0286618 A1 | 11/2011 | Vandali et al. | 381/320 |
| 2012/0243694 A1 | 9/2012 | Bradley et al. | 381/56 |
| 2012/0243705 A1 | 9/2012 | Bradley et al. | |
| 2012/0243707 A1 | 9/2012 | Bradley et al. | 381/98 |
| 2012/0265534 A1 | 10/2012 | Coorman et al. | |
| 2013/0041489 A1 | 2/2013 | Bradley et al. | 700/94 |
| 2013/0041656 A1 | 2/2013 | Bradley et al. | 704/207 |
| 2013/0041657 A1 | 2/2013 | Bradley et al. | |
| 2013/0041658 A1 | 2/2013 | Bradley et al. | 704/208 |
| 2014/0037095 A1 | 2/2014 | Bradley et al. | 381/56 |
| 2014/0086420 A1 | 3/2014 | Bradley et al. | |

FOREIGN PATENT DOCUMENTS

| | | |
|---|---|---|
| EP | 1 744 305 A2 | 1/2007 |
| JP | 01-257233 A | 10/1989 |
| WO | WO 2012/129255 | 9/2012 |
| WO | WO 2012/134991 | 10/2012 |
| WO | WO 2012/134993 | 10/2012 |
| WO | WO 2013/022914 | 2/2013 |
| WO | WO 2013/022918 | 2/2013 |
| WO | WO 2013/022923 | 2/2013 |
| WO | WO 2013/022930 | 2/2013 |

OTHER PUBLICATIONS

Kumar et al., "Speaker Recognition Using GMM", International Journal of Engineering Science and Technology, vol. 2, No. 6, 2010, [retrieved on: May 31, 2012], retrieved from the Internet: http://www.ijest.info/docs/IJEST10-02-06-112.pdf, pp. 2428-2436.

Kamath et al, "Independent Component Analysis for Audio Classification", IEEE 11th Digital Signal Processing Workshop & IEEE Signal Processing Education Workshop, 2004, [retrieved on: May 13, 2012], retrieved from the Internet: http://2002.114.89.42/resource/pdf/1412.pdf, pp. 352-355.

Vargas-Rubio et al., "An Improved Spectrogram Using the Multiangle Centered Discrete Fractional Fourier Transform", Proceedings of International Conference on Acoustics, Speech, and Signal Processing, Philadelphia, 2005 [retrieved on Jun. 24, 2012], retrieved from the internet: <URL: http://www.ece.unm.edu/faculty/beanthan/PUB/ICASSP-05-JUAN.pdf>, 4 pages.

Abatzoglou, "Fast Maximum Likelihood Joint Estimation of Frequency and Frequency Rate," *IEEE Transaction Aerospace and Electronic Systems*, vol. AES-22, Issue 6, pp. 708-715 (1986).

Adami et al., "Modeling Prosodic Dynamics for Speaker Recognition," *Proceedings of IEE International Conference in Acoustics, Speech and Signal Processing(ICASSP'*03), Hong Kong, 2003.

Badeau et al., "Expectation-Maximization Algorithm for Multi-Pitch Estimation and Seperation of Overlapping Harmonic Spectra", *IEEE International Conference on Acoustics, Speech and Signal Processing(ICASSP)*, Apr. 2009, 4 pages.

Boashash, "Time-Frequency Signal Analysis and Processing: A Comprehensive Reference", [online], Dec. 2003, retrieved on Sep. 26, 2012 from http://qspace.qu.edu.qa/bitstream/handle/10576/10686/Boashash%20book-part1_tfsap_concepts.pdf?seq.., 103 pages.

Camacho et al., "A Sawtooth Waveform Inspired Pitch Estimate for Speech and Music", *Journal of the Acoustical Society of America*, vol. 124, No. 3, Sep. 2008, pp. 1638-1652.

Cooke et al., "Robust automatic speech recognition with Missing and unreliable acoustic data," *Speech Communication*, vol. 34, Issue 3, Jun. 2001, pp. 267-285.

Cycling 74, "MSP Yutorial 26: Frequency Domain Signal Processing with pfft~" Jul. 6, 2008 (Captured via Internet Archive) http://www.cycling74.com Hu, Guoning, et al., "Monaural Speech Segregation Based on Pitch Tracking and Amplitude Modulation", *IEEE Transaction on Neural Networks*, vol. 15, No. 5, Sep. 2004, 16 pages.

(56) References Cited

OTHER PUBLICATIONS

Ioana, Cornel, et al., "The Adaptive Time-Frequency Distribution Using the Fractional Fourier Transform", 18° *Colloque sur le traitement du signal et des images*, 2001, pp. 52-55.

Kepesi, Marian, et al., "Adaptive Chirp-Based Time-Frequency Analysis of Speech Signals", *Speech Communication*, vol. 48, No. 5, 2006, pp. 474-492.

Kepesi, Marian, et al., "High-Resolution Noise-Robust Spectral-Based Pitch Estimation", 2005 4 pages.

Lahat, Meir, et al., "A Spectral Autocorrelation Method for Measurement of the Fundamental Frequency of Noise-Corrupted Speech", *IEEE Transactions on Acoustics, Speech, and Signal Processing*, vol. ASSP-35, No. 6, Jun. 1987, pp. 741-750.

Rabiner, "On the Use of Autocorrelation Analysis for Pitch Detection", *IEEE Translation on Acoustics, Speech, and Signal Processing*, vol. ASSP-25, No. 1 Feb. 1977, pp. 24-33.

Roa, Sergio, et al., "Fundamental Frequency Estimation Based on Pitch-Scaled Harmonic Filtering", 2007, 4 pages.

Robel, A., et al., "Efficient Spectral Envelope Estimation and Its Application to Pitch Shifting and Envelope Preservation", *Proc. Of the 8th Int. Conference on Digital Audio Effects(DAFx'05)*, Madrid, Spain, Sep. 20-22, 2005, 6 pages.

Werauaga et al., Adaptive Chirp-Based Time Frequency Analysis of Speech Signals, Speech Communication, vol. 48, No. 5, pp. 474-492 (2006).

Weruaga, Luis, et al., "Speech Analysis with the Fast Chirp Transform", Eusipco, www.eurasip.org/Proceedings/Eusipco/Eusipco2004/.../cr1374,pdf,2004, 4 pages.

Xia, Xiang-Gen, "Discrete Chirp-Fourier Transform and Its Application to Chirp Rate Estimation", *IEEE Transactions on Signal Processing*, vol. 48, No. 11, Nov. 2000, pp. 3122-3133.

Yin et al., "Pitch- and Formant-Based Order Adaption of the Fractional Fourier Transform and Its Application to Speech Recognition", *EURASIP Journal of Audio, Speech, and Music Processing*, vol. 2009, Article ID 304579, [online], Dec. 2009, Retrieved on Sep. 26, 2012 from http://downloads.hindai,vi.com/journals/asmp/2009/304579,pdf pages.

Doval et al., "Fundamental Frequency Estimation and Tracking Using Maximum Likelihood Harmonic Matching and HMMs," *IEEE International Conference on Acoustics, Speech, and Signal Processing, Proceedings*, New York, NY, 1:221-224 (Apr. 27, 1993).

Extended European Search Report mailed Feb. 12, 2015, as received in European Patent Application No. 12 821 868.2

Extended European Search Report mailed Oct. 9, 2014, as received in European Patent Application No. 12 763 782.5.

Extended European Search Report mailed Mar. 12, 2015, as received in European Patent Application No. 12 822 218.9.

Goto, "A Robust Predominant-Fo Estimation Method for Real-Time Detection of Melody and Bass Lines in CD Recordings," *Acoustics, Speech, and Signal Processing*, Piscataway, NJ, 2(5):757-760 (Jul. 5, 2000).

Mowlaee et al., "Chirplet Representation for Audio Signals Based on Model Order Selection Criteria," Computer Syatems and Applications, AICCSA 2009, IEEE/ACS International Conference on IEEE, Piscataway, NJ pp. 927-934 (May 10, 2009).

Weruaga et al., "The Fan-Chirp Transform for Non-Stationary Harmonic Signals," *Signal Processing, Elsevier Science Publishers B.V. Amsterdam, NL*, 87(6): 1505-1506 and 1512 (Feb. 24, 2007).

\* cited by examiner

SYSTEMS AND METHODS FOR RECONSTRUCTING AN AUDIO SIGNAL FROM TRANSFORMED AUDIO INFORMATION

RELATED APPLICATIONS

This application claims the priority benefit of U.S. provisional patent application No. 61/467,493, filed on Mar. 25, 2011, and entitled "Spectral Motion Transformation," which is hereby incorporated into this disclosure by reference in its entirety.

FIELD

The disclosure relates to reconstructing an audio signal obtained from a noisy environment based on pitch and harmonic amplitudes determined from transformed audio information and/or suppressing noise between harmonics of the sound in the transformed audio information by centering functions at individual harmonics in the transformed audio information.

BACKGROUND

Systems and method for reconstructing an audio signal are known. Existing techniques operate with relative accuracy and precision in the best of conditions. However, in "noisy" conditions (e.g., either sound noise or processing noise) the accuracy, precision, and/or speed of conventional techniques may drop off significantly. Since many of the settings and/or audio signals in and on which these techniques are applied may be considered noisy, conventional processing to reconstruct an audio signal may be only marginally useful.

SUMMARY

One aspect of the disclosure relates to a system and method of reconstructing an audio signal from transformed audio information. The audio signal may be resynthesized based on individual harmonics and corresponding pitches determined from the transformed audio information. Noise may be subtracted from the transformed audio information by interpolating across peak points and across trough points of harmonic pitch paths through the transformed audio information, and subtracting the trough point interpolations from the peak point interpolations. Noise between harmonics of the sound may be suppressed in the transformed audio information by centering functions at individual harmonics in the transformed audio information, the functions serving to suppress noise between the harmonics.

In some implementations, a system may be configured for reconstructing an audio signal from transformed audio information. The system may comprise one or more processors configured to execute computer program modules. The computer program modules may comprise one or more of an audio information module, a resynthesis module, a noise subtraction module, a fence model module, a reconstruction module, and/or other modules.

The audio information module may be configured to obtain transformed audio information representing one or more sounds. The audio signal may have a duration. That is, the audio signal may span a discrete period of time. The transformed audio information may have been transformed in discrete time sample windows over the audio signal. The time sample windows may be overlapping or non-overlapping in time. The transformed audio information may include pitch and/or pitch information associated with the audio signal. In some implementations, pitch and/or pitch information may be determined as described in one or both of U.S. patent application Ser. No. 13/205,483, filed Aug. 8, 2011, and entitled "System And Method For Tracking Sound Pitch Across An Audio Signal", and/or U.S. patent application Ser. No. 13/205,521, filed Aug. 8, 2011, and entitled "System And Method For Tracking Sound Pitch Across An Audio Signal Using Harmonic Envelope," which are hereby incorporated by reference into the present application in their entireties. The transformed audio information may specify magnitude of a coefficient related to signal intensity as a function of frequency for an audio signal and time. In some implementations, the transformed audio information for the time sample window may include a plurality of sets of transformed audio information. The individual sets of transformed audio information may correspond to different fractional chirp rates. Obtaining the transformed audio information may include transforming the audio signal, receiving the transformed audio information in a communications transmission, accessing stored transformed audio information, and/or other techniques for obtaining information.

The resynthesis module may be configured to resynthesize the audio signal based on individual harmonics and corresponding pitches determined from the transformed audio information. According to some implementations, resynthesizing the audio signal may include tracking one or more pitches of the sound to determine individual pitches and corresponding amplitudes as a function of time for individual harmonics of the sound. Individual harmonics may be synthesized using oscillators corresponding to individual harmonics. Synthesizing individual harmonics may include, for a given harmonic, integrating a corresponding pitch over time to determine a phase of the given harmonic. Individual ones of the oscillators may be based on a cosine function. The synthesized harmonics may be summed to obtain the resynthesized audio signal.

In some implementations, resynthesis module may be configured to solve any phase problems because the audio signal may be built through integration, where phase is a consequence of the audio signal and not something that needs to be factored in. Also, the degree of compression of the resynthesized audio signal may go below a kB per second for voice.

The resynthesized audio signal may be built from oscillators and parameters that specify pitch and harmonic amplitudes as a function of time. One or more of these parameters may be adjusted independently of the others without altering the phase and without harmonics suddenly dropping out. In some implementations, one or more parameters may be adjusted for pitch shifting, where the same timbre is preserved by preserving the pattern of harmonic amplitudes. Whisper synthesis may be performed, according to some implementations, where a set of evenly spaced harmonics is replaced by a white-noise source. This may preserve vowel shapes to give an indication as to what a given person would sound like if he were whispering.

The noise subtraction module may be configured to subtract noise from the transformed audio information. Subtracting noise may include interpolating across peak points and trough points of harmonic pitch paths through the transformed audio information. The peak points may lie along harmonic frequencies in the transformed audio information, and may be determined as a function of frequency and time for a given harmonic. The trough points may be positioned midway between peak points of adjacent harmonic frequencies in the transformed audio information, and may be determined as a function of frequency and/or time. Values associated with individual ones of the trough point interpolations may be subtracted from values associated with individual ones of the peak point interpolations to yield noise-reduced transformed audio information.

The fence model module may be configured to suppress noise between harmonics of the sound in the transformed audio information by centering functions at individual harmonics in the transformed audio information. The functions may serve to suppress noise between the harmonics in order to yield noise-reduced transformed audio information. The width of a given function may be based on a bandwidth of a corresponding harmonic. In some implementations, individual ones of the functions utilized by fence the model module may include a Gaussian function. According to some implementations, individual ones of the functions may include a rectangular function.

The reconstruction module may be configured to reconstruct an audio signal. In some implementations, one or more reverse transformations may be performed on transformed audio information and/or other non-time-domain information to obtain a reconstructed audio signal. The reconstruction module may be configured to reconstruct noise-reduced transformed audio information obtained from the noise subtraction module, the fence model module, and/or another source of noise-reduced transformed audio information. A reverse transformation used by the reconstruction module may correspond to a reverse and/or inverse of a transform performed on the original audio signal to produce the transformed audio information These and other objects, features, and characteristics of the system and/or method disclosed herein, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the invention. As used in the specification and in the claims, the singular form of "a", "an", and "the" include plural referents unless the context clearly dictates otherwise.

DETAILED DESCRIPTION

Figure 1:
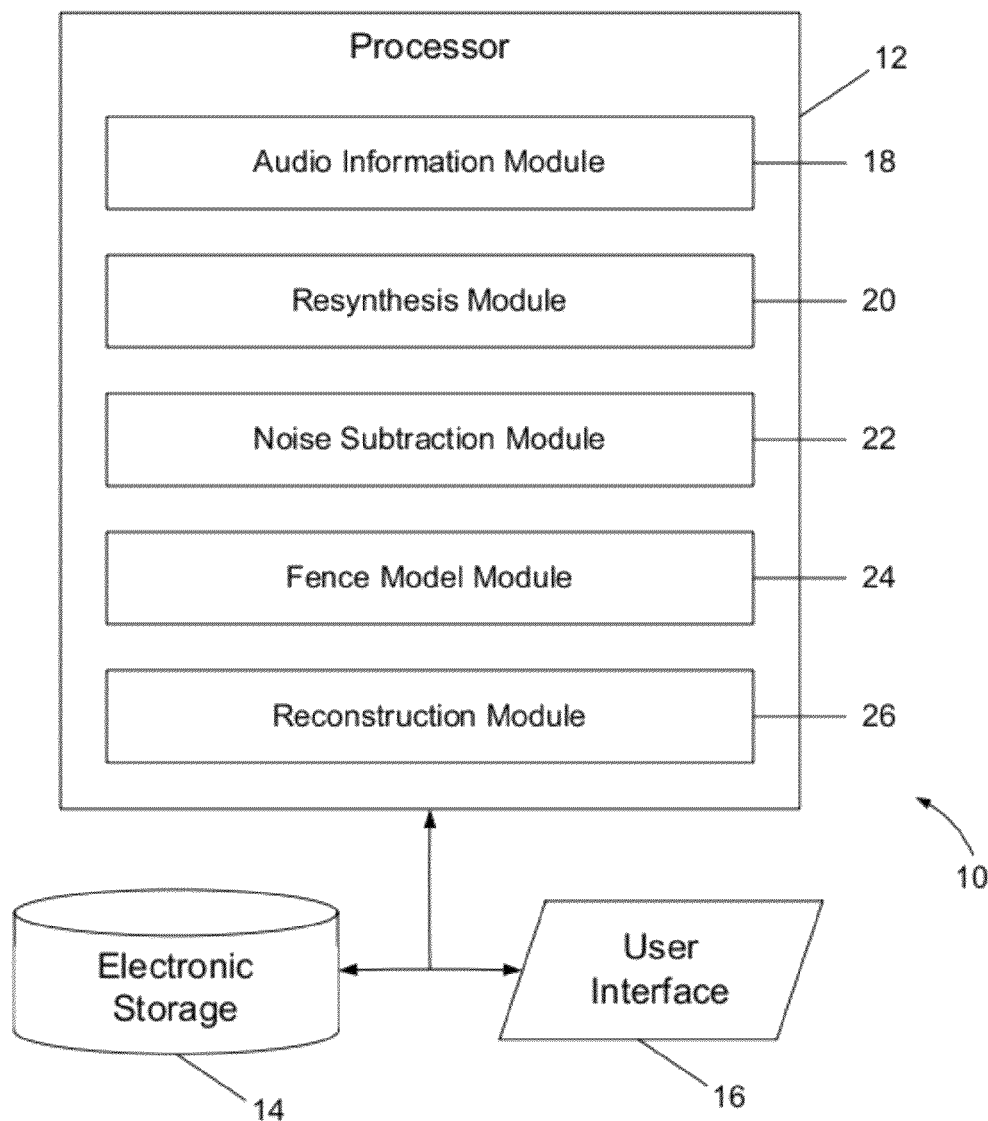
FIG. 1 illustrates a system configured for reconstructing an audio signal from transformed audio information, in accordance with one or more implementations.

FIG. 1 illustrates a system 10 configured for reconstructing an audio signal from transformed audio information, in accordance with one or more implementations. The transformed audio signal may be obtained from the audio signal through Fourier Transform, Fast Fourier Transform, Short Time Fourier Transform, Spectral Motion Transform, and/or other transforms. The audio signal may be resynthesized based on individual harmonics and corresponding pitches determined from the transformed audio information. Noise may be subtracted from the transformed audio information by interpolating across peak points and across trough points of harmonic pitch paths through the transformed audio information, and subtracting the trough point interpolations from the peak point interpolations. Noise between harmonics of the sound may be suppressed in the transformed audio information by centering functions at individual harmonics in the transformed audio information, the functions serving to suppress noise between the harmonics.

The system 10 may be implemented in an overarching system (not shown) configured to process the audio signal. For example, the overarching system may be configured to segment sounds represented in the audio signal (e.g., divide sounds into groups corresponding to different sources, such as human speakers, within the audio signal), classify sounds represented in the audio signal (e.g., attribute sounds to specific sources, such as specific human speakers), reconstruct sounds represented in the audio signal, and/or process the audio signal in other ways. In some implementations, system 10 may include one or more of one or more processors 12, electronic storage 14, a user interface 16, and/or other components.

The processor 12 may be configured to execute one or more computer program modules. The computer program modules may be configured to execute the computer program module(s) by software; hardware; firmware; some combination of software, hardware, and/or firmware; and/or other mechanisms for configuring processing capabilities on processor 12. In some implementations, the one or more computer program modules may include one or more of an audio information module 18, a resynthesis module 20, a noise subtraction module 22, a fence model module 24, a reconstruction module 26, and/or other modules.

The audio information module 18 may be configured to obtain transformed audio information representing one or more sounds. The transformed audio information may include a transformation of an audio signal into the frequency domain, a pseudo-frequency domain, a dynamical-frequency domain, and/or other non-temporal domains. By way of non-limiting example, the transformed audio information may be transformed from the audio signal by way of a Fourier transform, a fast-Fourier transform, a short-time-Fourier transform, and/or other transforms. The transformed audio information may include pitch and/or pitch information associated with the audio signal. In some implementations, pitch and/or pitch information may be determined as described one or both of U.S. patent application Ser. No. 13/205,483, filed Aug. 8, 2011, and entitled "System And Method For Tracking Sound Pitch Across An Audio Signal", and/or U.S. patent application Ser. No. 13/205,521, filed Aug. 8, 2011, and entitled "System And Method For Tracking Sound Pitch Across An Audio Signal Using Harmonic Envelope," which are hereby incorporated by reference into the present application in their entireties. The transformed audio information may include a transformation of an audio signal into a frequency-chirp domain, such as that described in U.S. patent application Ser. No. 13/205,424, filed Aug. 8, 2011, and entitled "System And Method For Processing Sound Signals Implementing A Spectral Motion Transform" which is hereby incorporated into this disclosure by reference in its entirety. The transformed audio information may have been transformed in discrete time sample windows over the audio signal. The time sample windows may be overlapping or non-overlapping in time. Generally, the transformed audio information may specify magnitude of a coefficient related to signal intensity as a function of frequency, time, chirp, and/or other parameters for an audio signal within a time sample window.

Figure 2:
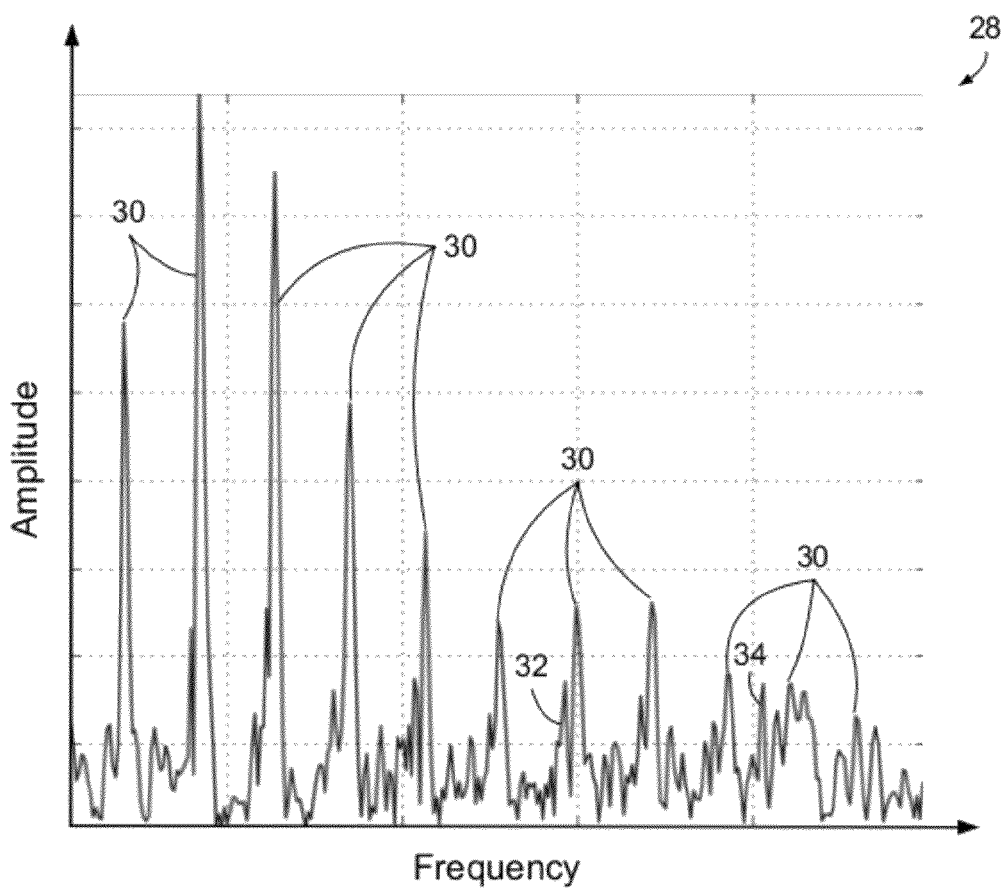
FIG. 2 illustrates an exemplary plot of transformed audio information.

By way of illustration, FIG. 2 depicts an exemplary plot 28 of transformed audio information. The plot 28 may depict a magnitude of a coefficient related to energy as a function of frequency. The transformed audio information represented by plot 28 may include a harmonic sound, represented by a series of spikes 30 in the magnitude of the coefficient at the frequencies of the harmonics of the harmonic sound. Assuming that the sound is harmonic, spikes 30 may be spaced apart at intervals that correspond to the pitch (ϕ) of the harmonic sound. As such, individual spikes 30 may correspond to individual ones of the overtones of the harmonic sound.

Other spikes (e.g., spikes 32 and/or 34) may be present in the transformed audio information. These spikes may not be associated with harmonic sound corresponding to spikes 30. The difference between spikes 30 and spike(s) 32 and/or 34 may not be amplitude, but instead frequency, as spike(s) 32 and/or 34 may not be at a harmonic frequency of the harmonic sound. As such, these spikes 32 and/or 34, and the rest of the amplitude between spikes 30 may be a manifestation of noise in the audio signal. As used in this instance, "noise" may not refer to a single auditory noise, but instead to sound (whether or not such sound is harmonic, diffuse, white, or of some other type) other than the harmonic sound associated with spikes 30.

The transformation that yields the transformed audio information from the audio signal may result in the coefficient related to signal intensity being a complex number. The transformation may include an operation to make the complex number a real number. This may include, for example, taking the square of the modulus of the complex number, and/or other operations for making the complex number a real number. In some implementations, the complex number for the coefficient generated by the transform may be preserved. In such implementations, for example, the real and imaginary portions of the coefficient may be analyzed separately, at least at first. By way of illustration, plot 28 may represent the real portion of the coefficient, and a separate plot (not shown) may represent the imaginary portion of the coefficient as a function of frequency. The plot representing the imaginary portion of the coefficient as a function of frequency may have spikes at the harmonics of the harmonic sound that corresponds to spikes 30.

In some implementations, the transformed audio information may represent all of the energy present in the audio signal, or a portion of the energy present in the audio signal. For example, if the transformation of the audio signal places the audio signal into the frequency-chirp domain, the coefficient related to signal intensity may be specified as a function of frequency and fractional chirp rate. In such examples, the transformed audio information may include a representation of the energy present in the audio signal having a common fractional chirp rate (e.g., a one dimensional slice through a two-dimensional frequency-chirp domain to produce a frequency domain representation with a fixed chirp rate and/or other fixed parameter).

Referring back to FIG. 1, resynthesis module 20 may be configured to resynthesize the audio signal based on individual harmonics and corresponding pitches determined from the transformed audio information. According to some implementations, resynthesizing the audio signal may include tracking one or more pitches of the sound to determine individual pitches and corresponding amplitudes as a function of time for individual harmonics of the sound. Individual harmonics may be synthesized using oscillators corresponding to individual harmonics. Synthesizing individual harmonics may include, for a given harmonic, integrating a corresponding pitch over time to determine the unwrapped phase of the given harmonic. Individual ones of the oscillators may be based on a cosine function. The synthesized harmonics may be summed to obtain the resynthesized audio signal.

According to some implementations, the output y as a function of time t of the $i^{th}$ oscillator may be expressed as, or similar to, $$yi(t) = \cos \int_0^t i\phi(\tau)d\tau,$$

where ϕ is pitch (first harmonic) as a function of time. This equation may be fixed, so the entire representation of a sound is stored in the pitch and harmonic amplitude parameters. Time courses may be represented sparsely because pitch and envelope (the set of harmonic amplitudes) change slowly per time relative to the sampling rate. For example, a cubic spline with 20 knots may provide an accurate fit to the pitch time course over one second for a human voice. Similarly, the harmonic amplitudes may be represented with about 10 knots along the frequency dimension and 20 per second in time to form an "amplitude surface" (e.g., amplitude as a function of frequency and time, and/or transformed audio information) expressing the changing envelope. Some or all harmonic amplitudes and envelopes for synthesizing consonants with a white noise source may be shaped by such an amplitude surface.

In some implementations, resynthesis module 20 may be configured to solve any phase problems because the audio signal may be built through integration, where phase is a consequence of the audio signal and not something that needs to be factored in. Also, the degree of compression of the resynthesized audio signal may go below a kB per second for voice, which is far better than the current mp3 standard.

The resynthesized audio signal may be built from oscillators and parameters that specify pitch and harmonic amplitudes as a function of time. One or more of these parameters may be adjusted independently of the others without altering the phase and without harmonics suddenly dropping out.

In some implementations, individual ones of the oscillators may include a white noise source to simulate a whispered version of the voice that retains word shaping and speech rhythms. Parameters may be altered to adjust for known channel distortions. For example, cell phones vary subtly in their pass-band, but generally have the same approximate high and low roll-offs. A correction may be made by dividing the transformed audio information by the roll-off transfer function.

The noise subtraction module 22 may be configured to subtract noise from the transformed audio information. Subtracting noise may include interpolating across peak points of harmonic pitch paths through the transformed audio information. The peak points may lie along harmonic frequencies in the transformed audio information, and may be determined as a function of frequency and time for a given harmonic. In some implementations, interpolation across the peak points may include polynomial interpolation, use of splines, and/or other interpolation techniques.

Subtracting noise may further include interpolating across trough points of harmonic pitch paths through the transformed audio information. The trough points may be positioned midway between peak points of adjacent harmonic frequencies in the transformed audio information, and may be determined as a function of frequency and time. In some implementations, interpolation across the trough points may include polynomial interpolation, use of splines, and/or other interpolation techniques. Such splines may include linear, quadratic, cubic, and/or other splines. Values associated with individual ones of the trough point interpolations may be subtracted from values associated with individual ones of the peak point interpolations to yield noise-reduced transformed audio information.

The fence model module 24 may be configured to suppress noise between harmonics of the sound in the transformed audio information by centering functions at individual harmonics in the transformed audio information. The functions may serve to suppress noise between the harmonics in order to yield noise-reduced transformed audio information. The width of a given function may be based on a bandwidth of a corresponding harmonic.

In some implementations, individual ones of the functions utilized by fence model module 24 may include a Gaussian function. Such a Gaussian function may be configured to suppress information between the harmonics. The Gaussian function may be configured to replace information associated with individual harmonics with Gaussian (or other) curves to provide noise-reduced transformed audio information. A given Gaussian curve may be fitted to a corresponding harmonic.

An audio signal may be reconstructed from the noise-reduced transformed audio information, as discussed in connection with the reconstruction module 26. Such a reconstructed audio signal may closely resemble the undistorted original audio signal, even down to 3 dB noise. Additionally, the reconstructed audio signal may be more compact relative to the original audio signal because only the harmonic frequencies and corresponding amplitudes need to be transmitted to resynthesize the reconstructed audio signal.

According to some implementations, individual ones of the functions may include a rectangular fence. Such a fence may be configured to zero information between the harmonics while preserving information associated with the harmonics. In some implementations, one or more functions utilized by fence model module 24 may be separately applied to real and imaginary components of the transformed audio information.

The reconstruction module 26 may be configured to reconstruct an audio signal and/or portions of an audio signal (e.g., vowel and/or consonant sounds). In some implementations, one or more reverse transformations may be performed on transformed audio information and/or other non-time-domain information to obtain a reconstructed audio signal. That is, reconstruction may include converting a frequency domain representation and/or frequency-chirp domain representation to a time-domain representation, according to some implementations. The reconstruction module 26 may be configured to reconstruct noise-reduced transformed audio information obtained from noise subtraction module 22, fence model module 24, and/or another source of noise-reduced transformed audio information. A reverse transformation used by reconstruction module 26 may correspond to a reverse and/or inverse of a transform performed on the original audio signal to produce the transformed audio information.

Processor 12 may be configured to provide information processing capabilities in system 10. As such, processor 12 may include one or more of a digital processor, an analog processor, a digital circuit designed to process information, an analog circuit designed to process information, a state machine, and/or other mechanisms for electronically processing information. Although processor 12 is shown in FIG. 1 as a single entity, this is for illustrative purposes only. In some implementations, processor 12 may include a plurality of processing units. These processing units may be physically located within the same device, or processor 12 may represent processing functionality of a plurality of devices operating in coordination (e.g., "in the cloud", and/or other virtualized processing solutions).

It should be appreciated that although modules 18, 20, 22, 24, and 26 are illustrated in FIG. 1 as being co-located within a single processing unit, in implementations in which processor 12 includes multiple processing units, one or more of modules 18, 20, 22, 24, and/or 26 may be located remotely from the other modules. The description of the functionality provided by the different modules 18, 20, 22, 24, and/or 26 described below is for illustrative purposes, and is not intended to be limiting, as any of modules 18, 20, 22, 24, and/or 26 may provide more or less functionality than is described. For example, one or more of modules 18, 20, 22, 24, and/or 26 may be eliminated, and some or all of its functionality may be provided by other ones of modules 18, 20, 22, 24, and/or 26. As another example, processor 12 may be configured to execute one or more additional modules that may perform some or all of the functionality attributed below to one of modules 18, 20, 22, 24, and/or 26.

Electronic storage 14 may comprise electronic storage media that stores information. The electronic storage media of electronic storage 14 may include one or both of system storage that is provided integrally (i.e., substantially non-removable) with system 10 and/or removable storage that is removably connectable to system 10 via, for example, a port (e.g., a USB port, a firewire port, etc.) or a drive (e.g., a disk drive, etc.). Electronic storage 14 may include one or more of optically readable storage media (e.g., optical disks, etc.), magnetically readable storage media (e.g., magnetic tape, magnetic hard drive, floppy drive, etc.), electrical charge-based storage media (e.g., EEPROM, RAM, etc.), solid-state storage media (e.g., flash drive, etc.), and/or other electronically readable storage media. Electronic storage 14 may include virtual storage resources, such as storage resources provided via a cloud and/or a virtual private network. Electronic storage 14 may store software algorithms, information determined by processor 12, information received via user interface 16, and/or other information that enables system 10 to function properly. Electronic storage 14 may be a separate component within system 10, or electronic storage 14 may be provided integrally with one or more other components of system 10 (e.g., processor 12).

User interface 16 may be configured to provide an interface between system 10 and users. This may enable data, results, and/or instructions and any other communicable items, collectively referred to as "information," to be communicated between the users and system 10. Examples of interface devices suitable for inclusion in user interface 16 include a keypad, buttons, switches, a keyboard, knobs, levers, a display screen, a touch screen, speakers, a microphone, an indicator light, an audible alarm, and a printer. It is to be understood that other communication techniques, either hard-wired or wireless, are also contemplated by the present invention as user interface 16. For example, the present invention contemplates that user interface 16 may be integrated with a removable storage interface provided by electronic storage 14. In this example, information may be loaded into system 10 from removable storage (e.g., a smart card, a flash drive, a removable disk, etc.) that enables the user(s) to customize the implementation of system 10. Other exemplary input devices and techniques adapted for use with system 10 as user interface 14 include, but are not limited to, an RS-232 port, RF link, an IR link, modem (telephone, cable or other). In short, any technique for communicating information with system 10 is contemplated by the present invention as user interface 14.

Figure 3:
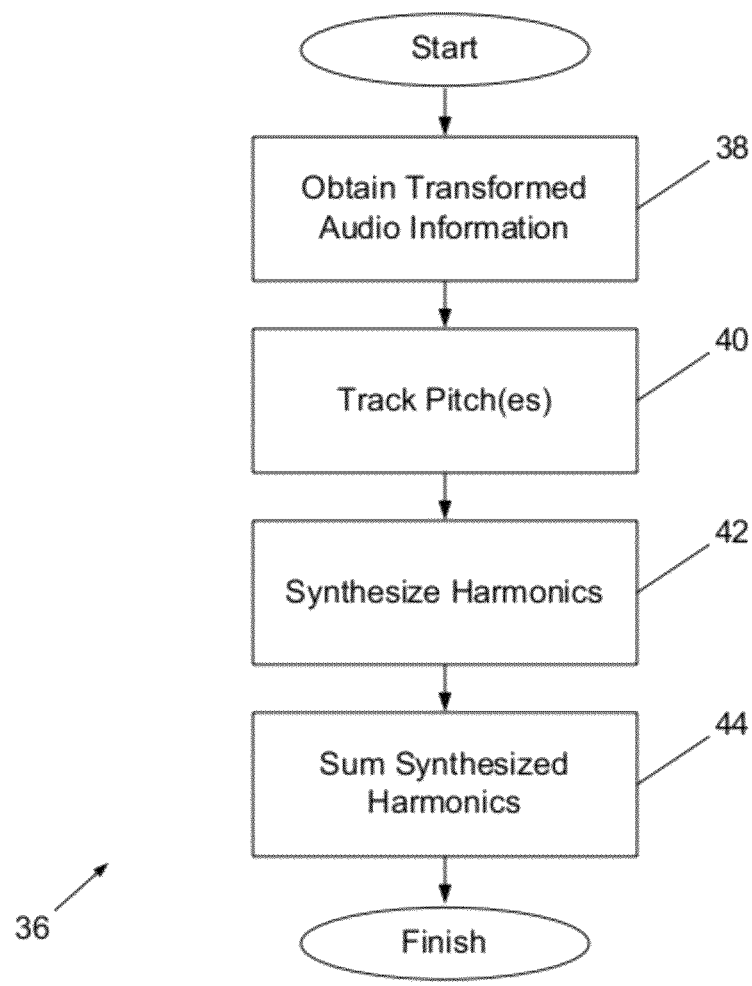
FIG. 3 illustrates a method for reconstructing an audio signal from transformed audio information by resynthesizing the audio signal based on individual harmonics and corresponding pitches determined from the transformed audio information, in accordance with one or more implementations.

FIG. 3 illustrates a method 36 for reconstructing an audio signal from transformed audio information by resynthesizing the audio signal based on individual harmonics and corresponding pitches determined from the transformed audio information, in accordance with one or more implementations. The operations of method 36 presented below are intended to be illustrative. In some implementations, method 36 may be accomplished with one or more additional operations not described, and/or without one or more of the operations discussed. Additionally, the order in which the operations of method 36 are illustrated in FIG. 3 and described below is not intended to be limiting.

At operation 38, transformed audio information representing a sound may be obtained. The transformed audio information may specify magnitude of a coefficient related to signal intensity as a function of frequency for the audio signal and time. In some implementations, operation 38 may be performed by an audio information module that is the same as or similar to audio information module 18 (shown in FIG. 1 and described above).

At operation 40, one or more pitches of the sound may be tracked to determine individual pitches and corresponding amplitudes as a function of time for individual harmonics of the sound. In some implementations, operation 40 may be performed by a resynthesis module that is the same as or similar to resynthesis module 20 (shown in FIG. 1 and described above).

At operation 42, individual harmonics may be synthesized using oscillators corresponding to individual harmonics. According to some implementations, only harmonics associated with a desired sound (e.g., speech from a particular speaker) within the original audio signal may be synthesized, thus excluding unwanted sounds. In some implementations, operation 42 may be performed by a resynthesis module that is the same as or similar to resynthesis module 20 (shown in FIG. 1 and described above).

At operation 44, the synthesized harmonics may be summed to obtain the resynthesized audio signal. In some implementations, operation 44 may be performed by a resynthesis module that is the same as or similar to resynthesis module 20 (shown in FIG. 1 and described above).

Figure 4:
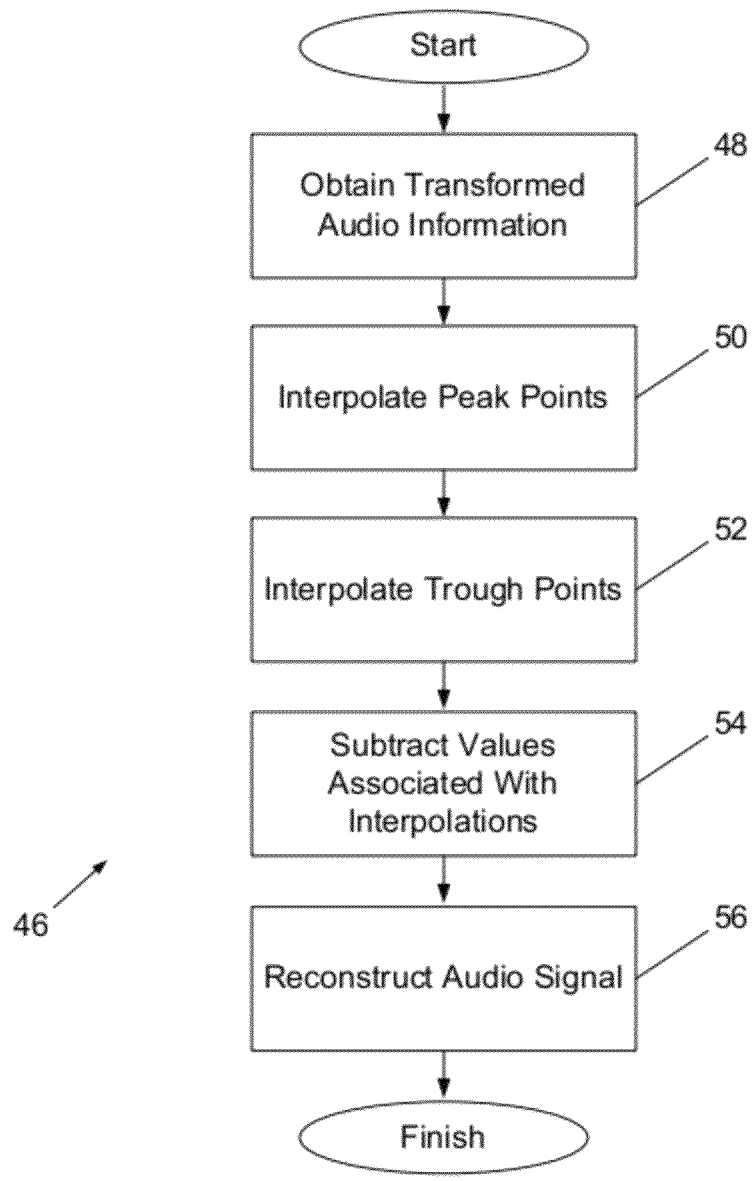
FIG. 4 illustrates a method for reconstructing an audio signal from transformed audio information where noise is subtracted from the transformed audio information, in accordance with one or more implementations.

FIG. 4 illustrates a method 46 for reconstructing an audio signal from transformed audio information where noise is subtracted from the transformed audio information, in accordance with one or more implementations. The operations of method 46 presented below are intended to be illustrative. In some implementations, method 46 may be accomplished with one or more additional operations not described, and/or without one or more of the operations discussed. Additionally, the order in which the operations of method 46 are illustrated in FIG. 4 and described below is not intended to be limiting.

At operation 48, transformed audio information representing a sound may be obtained. The transformed audio information may specify magnitude of a coefficient related to signal intensity as a function of frequency for the audio signal and time. In some implementations, operation 48 may be performed by an audio information module that is the same as or similar to audio information module 18 (shown in FIG. 1 and described above).

At operation 50, peak points of harmonic pitch paths may be interpolated through the transformed audio information. The peak points may lie along harmonic frequencies in the transformed audio information, and may be determined as a function of frequency and time for a given harmonic. In some implementations, operation 50 may be performed by a noise subtraction module that is the same as or similar to noise subtraction module 22 (shown in FIG. 1 and described above).

At operation 52, trough points of harmonic pitch paths may be interpolated through the transformed audio information. The trough points may be positioned midway between peak points of adjacent harmonic frequencies in the transformed audio information, and may be determined as a function of frequency and time. In some implementations, operation 52 may be performed by a noise subtraction module that is the same as or similar to noise subtraction module 22 (shown in FIG. 1 and described above).

At operation 54, values associated with individual ones of the trough point interpolations may be subtracted from values associated with individual ones of the peak point interpolations to yield noise-reduced transformed audio information. In some implementations, operation 54 may be performed by a noise subtraction module that is the same as or similar to noise subtraction module 22 (shown in FIG. 1 and described above).

At operation 56, the audio signal may be reconstructed based on a reverse transformation of the noise-reduced transformed audio information. In some implementations, operation 56 may be performed by a reconstruction module that is the same as or similar to reconstruction module 26 (shown in FIG. 1 and described above).

Figure 5:
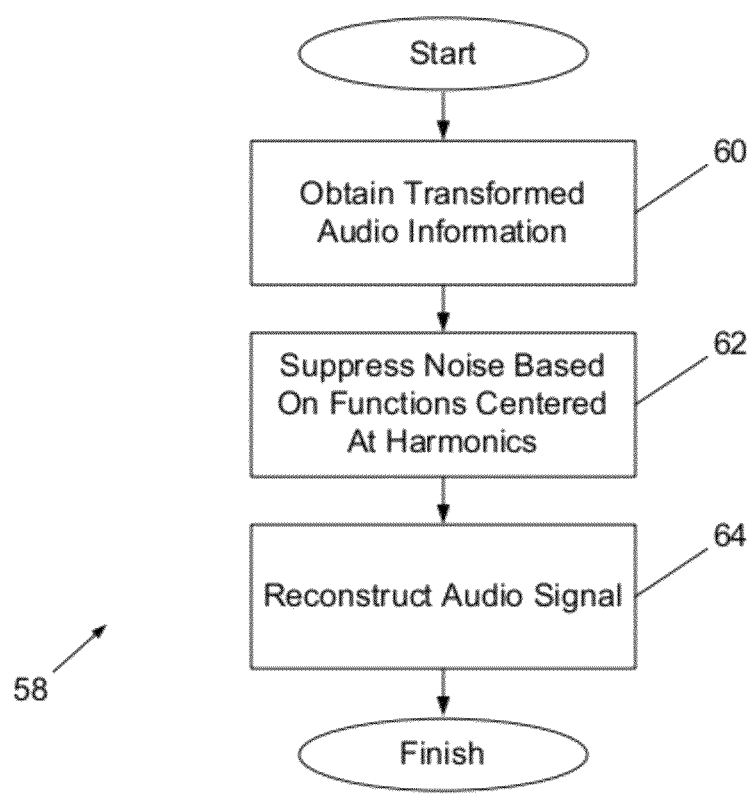
FIG. 5 illustrates a method for reconstructing an audio signal from transformed audio information where noise is suppressed between harmonics of the sound in the transformed audio information, in accordance with one or more implementations.

FIG. 5 illustrates a method 58 for reconstructing an audio signal from transformed audio information where noise is suppressed between harmonics of the sound in the transformed audio information, in accordance with one or more implementations. The operations of method 58 presented below are intended to be illustrative. In some implementations, method 58 may be accomplished with one or more additional operations not described, and/or without one or more of the operations discussed. Additionally, the order in which the operations of method 58 are illustrated in FIG. 5 and described below is not intended to be limiting.

At operation 60, transformed audio information representing a sound may be obtained. The transformed audio information may specify magnitude of a coefficient related to signal energy as a function of frequency for the audio signal and time. In some implementations, operation 60 may be performed by an audio information module that is the same as or similar to audio information module 18 (shown in FIG. 1 and described above).

At operation 62, noise between harmonics of the sound may be suppressed in the transformed audio information by centering functions at individual harmonics in the transformed audio information. The functions may serve to suppress noise between the harmonics to yield noise-reduced transformed audio information. The width of a given function may be based on a bandwidth of a corresponding harmonic. In some implementations, operation 62 may be performed by a fence model module that is the same as or similar to fence model module 24 (shown in FIG. 1 and described above).

At operation 64, the audio signal may be reconstructed based on a reverse transformation of the noise-reduced transformed audio information. In some implementations, operation 64 may be performed by a reconstruction module that is the same as or similar to reconstruction module 26 (shown in FIG. 1 and described above).

In some implementations, methods 36, 46, and/or 58 may be implemented in one or more processing devices (e.g., a digital processor, an analog processor, a digital circuit designed to process information, an analog circuit designed to process information, a state machine, and/or other mechanisms for electronically processing information). The one or more processing devices may include one or more devices executing some or all of the operations of methods 36, 46, and/or 58 in response to instructions stored electronically on an electronic storage medium. The one or more processing devices may include one or more devices configured through hardware, firmware, and/or software to be specifically designed for execution of one or more of the operations of methods 36, 46, and/or 58.

Although the system(s) and/or method(s) of this disclosure have been described in detail for the purpose of illustration based on what is currently considered to be the most practical and preferred implementations, it is to be understood that such detail is solely for that purpose and that the disclosure is not limited to the disclosed implementations, but, on the contrary, is intended to cover modifications and equivalent arrangements that are within the spirit and scope of the appended claims. For example, it is to be understood that the present disclosure contemplates that, to the extent possible, one or more features of any implementation can be combined with one or more features of any other implementation.

What is claimed is:

1. A method for reconstructing an audio signal from transformed audio information, the method comprising:
    obtaining transformed audio information representing a sound, wherein the transformed audio information specifies magnitude of a coefficient related to signal intensity as a function of frequency for the audio signal and time; and
    resynthesizing the audio signal based on individual harmonics and corresponding pitches determined from the transformed audio information, wherein resynthesizing the audio signal includes:
        tracking one or more pitches of the sound to determine individual pitches and corresponding amplitudes as a function of time for individual harmonics of the sound,
        synthesizing individual harmonics using oscillators corresponding to individual harmonics, and
        summing the synthesized harmonics to obtain the resynthesized audio signal.

2. The method of claim 1, wherein synthesizing individual harmonics includes, for a given harmonic, integrating a corresponding pitch over time to determine a phase of the given harmonic.

3. The method of claim 1, wherein individual ones of the oscillators are based on a cosine function.

4. The method of claim 1, wherein individual ones of the oscillators include a white noise source.

* * * * *